United States Patent [19]

Drexler et al.

[11] 3,984,815
[45] Oct. 5, 1976

[54] TIME OF EVENT RECORDER

[75] Inventors: James V. Drexler, St. Paul; Alan D. Kaske, Minneapolis; Kenneth L. Pearson, Burnsville, all of Minn.

[73] Assignee: Sperry Rand Corporation, New York, N.Y.

[22] Filed: May 2, 1975

[21] Appl. No.: 574,144

[52] U.S. Cl. .......................... 340/172.5; 235/92 T
[51] Int. Cl.² .................... G06F 9/00; G06F 11/04
[58] Field of Search ............ 340/172.5; 235/150.3, 235/92 CP, 92 TF, 92 T; 324/178, 181

[56] References Cited
UNITED STATES PATENTS

| | | | |
|---|---|---|---|
| 3,723,975 | 3/1973 | Kurtz, Jr. et al. | 340/172.5 |
| 3,771,144 | 11/1973 | Belady et al. | 340/172.5 |
| 3,894,218 | 7/1975 | Weissler | 235/150.3 |

*Primary Examiner*—Joseph F. Ruggiero
*Attorney, Agent, or Firm*—Thomas J. Nikolai; Kenneth T. Grace; Marshall M. Truex

[57] ABSTRACT

A time of event recorder in which a Gray Code counter is regularly advanced at a predetermined frequency by a crystal controlled oscillator and the outputs from the counter stages are applied to the digit lines of a MATED FILM memory array, such that when an event associated with a given word line of the memory occurs, the counter contents at the time of occurrence of the event are stored in that memory word register. A second array of MATED FILM elements is also provided which has its digit lines energized at a fixed submultiple of the frequency of the crystal controlled oscillator to provide greater accuracy and resolution than is obtainable from the Gray Code counter. The elapsed time between two events may be obtained by reading out two words from the memory and determining the difference in counts associated with the two events under consideration.

10 Claims, 6 Drawing Figures

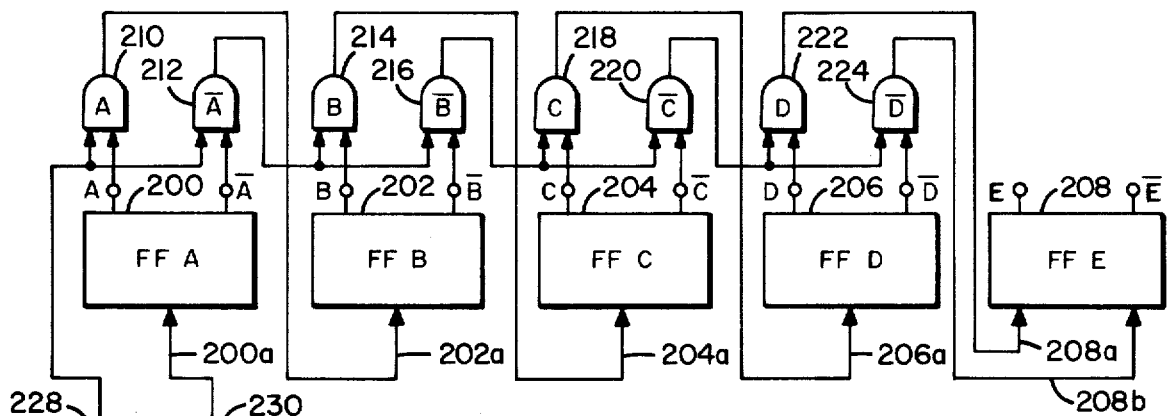
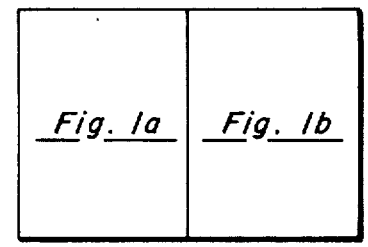
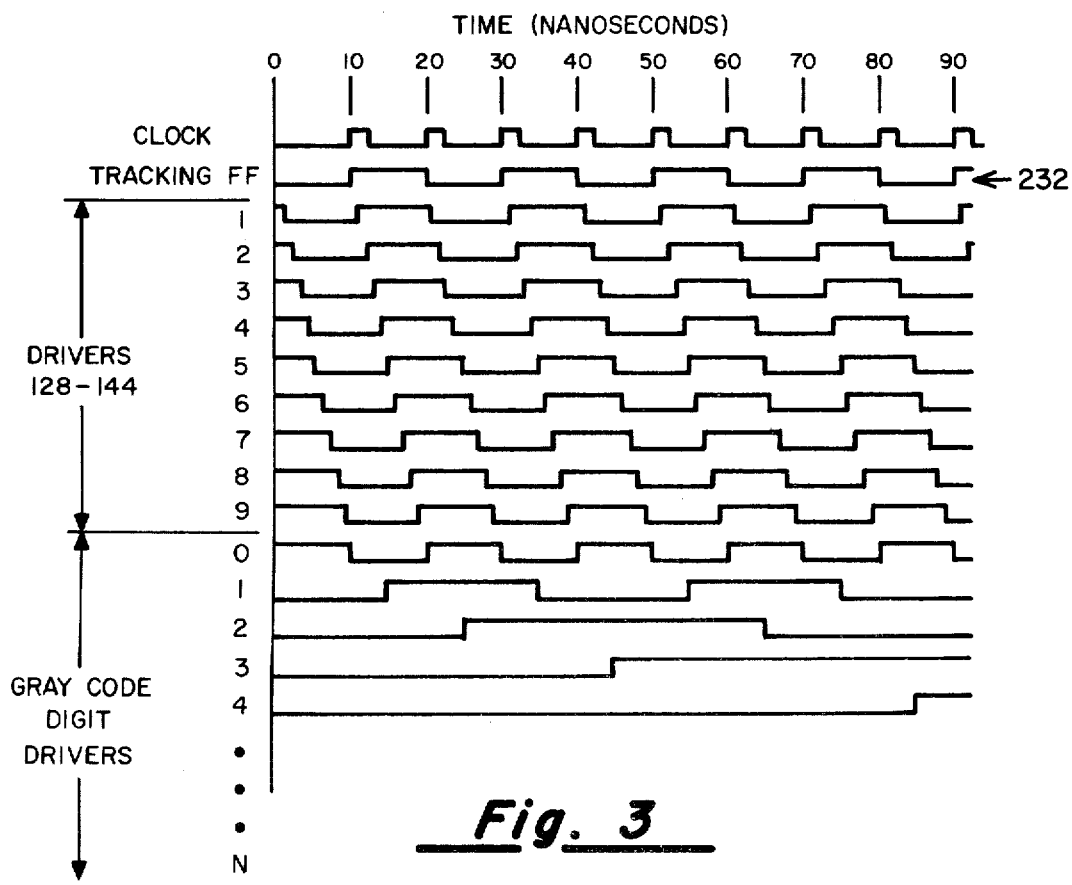

TIME OF EVENT RECORDER

BACKGROUND OF THE INVENTION

This invention relates primarily to an electronic timing device and more specifically to a highly accurate time of event recorder for precisely measuring the elapsed time between two or more successively occurring events.

In many scientific experiments, it is desirable to measure with a high degree of accuracy the time of occurrence of an event with respect to a first point in time or the difference between two successively occurring events, which events may be taking place practically simultaneously, i.e., with an extremely short elapsed time therebetween. For example, in testing and debugging complex electronic equipment such as a digital computer, it is often desirable to know precisely the elapsed time between two successive pulses appearing in the system so that proper synchronization of separate logic arrays used in the system can be obtained. Also, it is often necessary to record the time of occurrence of several events and provide a means of determining the elapsed time between a first event and any one of a number of later events occuring within a predetermined time span.

Known prior art arrangements commonly use a stopwatch approach wherein a first event turns on a source of regularly occurring timing pulses which are accumulated in a counter and a second event is used to turn off the timing pulse source so that the elapsed time is represented by the contents of the counter. Where several events are to be compared, this approach becomes unsatisfactory from a cost standpoint in that several synchronized clock sources and counter banks are required.

The present invention provides an extremely efficient and highly accurate means for recording for a predetermined duration, the time of occurrence of a plurality of events along with means for reading out a numerical quantity indicative of the time elapsed between the occurrence of any two of said plural events. More specifically, the preferred embodiment to be described allows the time of occurrence of 32 separate events to be recorded, provided they occur within a predetermined time span. The device is constructed such that elapsed time intervals as short as 1 nanosecond ($10^{-9}$ seconds) can be reliably determined.

In accordance with the teachings of the preferred embodiment, there is provided a first array of MATED FILM storage elements which may have 16 digit lines and 32 word lines. Coupled individually to the 16 digit lines is one stage of a 16 stage Gray Code counter, which is connected to receive as its input, pulses from a temperature compensated crystal controlled oscillator. The count in the Gray Code counter may be advanced every 10 nanoseconds, for example.

Also included is a second array of MATED FILM elements having 10 digit lines and 32 word lines, said word lines being a continuation of the word lines in the first array. While for ease of understanding, the storage arrays may be considered as being divided into two parts, in practice the two arrays may be integrally formed in a single manufacturing process. The output from the crystal clock is coupled directly to a first digit line in the second array and each succeeding digit line is coupled through a 1 nanosecond delay element to the preceding digit line. Hence, between each advance of the Gray Code counter, the digit lines in the second array are energized in sequence and at 1 nanosecond intervals to, in effect, break the basic clock period into ten equal parts or time intervals.

Upon detection of an event to be recorded, the word line associated with that event is energized, causing the storage elements located at the intersections of that word line with the digit or bit lines in the first and second arrays to record the contents of the Gray Code counter and a value equal to the number of one nanosecond periods which elapsed since the counter was last toggled. Later events caused other word lines in the two arrays to be energized for storing the then contents of the Gray Code counter and the submultiple of the clock pulse period.

To read out the information, a desired word line is addressed and a read current is applied thereto, causing signals to be induced on the digit lines in parallel, indicative of the information stored in the storage elements linked by said addressed word line. The data in the first array is inserted in a first output register. It then may be converted to a decimal representation, multiplied by 10 nanoseconds and the direct decimal representation of the submultiple count from the second array then may be added to the product to provide the time figure. The process then may be repeated for a second event and the result may be subtracted from the first time figure to indicate the elapsed time between the two events.

OBJECTS

It is accordingly the primary object of this invention to provide a time of event recording and indicating device.

Another object of the invention is to provide an elapsed time measuring instrument capable of measuring extremely short time intervals with high accuracy.

Still another object of the invention is to provide a novel elapsed time measuring instrument in which the time of occurrence of successive events are recorded and means are provided for subsequently reading out and comparing the time at which each event occurred so the difference therebetween can be computed.

A further object of the invention is to provide the elapsed time recorder which advantageously utilizes the rapid switching properties of MATED FILM type memory elements to provide greater accuracy and resolution than heretofore obtainable with instrumentation of comparable cost.

A still further object of the invention is to provide a means for recording periods which are submultiples of the basic clock frequency, which periods can be added to the count accumulated in a counter advanced by said clock to provide a more accurate indication of the time of occurrence of a given event.

These and other objects and advantages of the invention may be obtained from a reading of the following detailed description of the preferred embodiment when considered in conjunction with the accompanying drawings in which:

DESCRIPTION OF THE DRAWINGS

FIGS. 1, 1a, and 1b illustrate by means of a block diagram the organization of the preferred embodiment of the elapsed time recorder of the present invention.

FIG. 2 is a logic diagram of a Gray Code counter suitable for use in the system of FIG. 1.

FIG. 3 illustrates by means of a series of waveforms the time relationships between various signals observed at various points in the system of FIG. 1.

DESCRIPTION OF THE PREFERRED EMBODIMENT

Figure 1A:
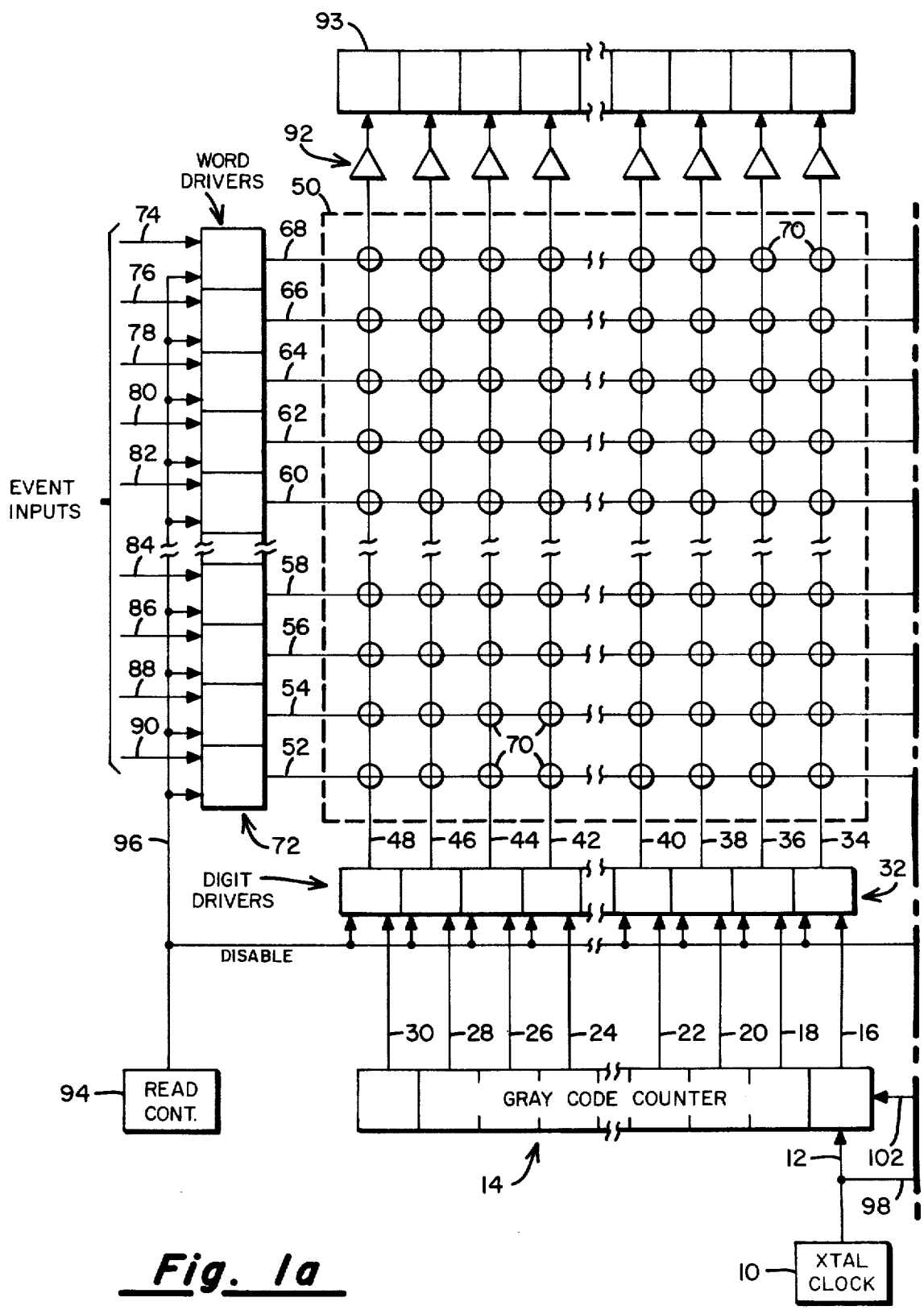

Referring now to FIG. 1a there is shown by means of schematic block diagram the organization and construction of the preferred embodiment of the invention. A source of regularly occurring square wave pulses is provided by a crystal controlled oscillator or clock 10, the output of which is connected by means of a conductor 12 to the input of a Gray Code counter 14. As will become apparent from the following description, a Gray Code counter is most suitable for the instant application in that it possesses the characteristic of having only one stage thereof at a time altered upon receipt of an advance pulse from the crystal clock 10.

Referring now to FIG. 2, there is illustrated by means of a logic diagram, the implementation of a reflected binary code (Gray Code) counter suitable for use as the counter 14 in FIG. 1. While only 5 stages A, B, C, D and E are illustrated in FIG. 2, it should be obvious to those of ordinary skill, how additional stages may be added to allow for a larger modulus.

The counter of FIG. 2 includes a plurality of bistable toggle type flip-flops 200 through 206 each having a toggle input terminal 200a, 202a, 204a and 206a. The final stage (highest order) comprises a Set-Clear type flip-flop 208 and, as such, has a "set" input terminal 208a and a "clear" input terminal 208b. Each of the flip-flops 200 through 208 has a pair of output terminals for carrying complementary signals labeled A, $\bar{A}$; B, $\bar{B}$ ... E, $\bar{E}$ as illustrated.

Associated with each of the output terminals of stages A, B, C and D is a coincidence circuit (AND gate) 210 through 224 which, for convenience, is also labeled alphabetically to identify which particular flip-flop output terminal it is connected to. For example, AND gate 210 has a first input terminal connected to the true output terminal, A, of the stage A flip-flop 200 and AND gate 212 has one input thereof connected to the complement output terminal, $\bar{A}$, of the stage A flip-flop 200. Similarly, the gates B, $\bar{B}$; C, $\bar{C}$; D and $\bar{D}$ are connected to the correspondingly labeled flip-flop output terminals.

The output terminals of each of the gates A, B, C and D are connected to the input terminal of their adjacent higher order stage. Specifically, the output from gate 210 is connected to the input terminal 202a of the stage B flip-flop. The output from gate 214 is connected to the input terminal 204a of Stage C, etc.

The output terminals of each of the gates $\bar{A}$, $\bar{B}$, $\bar{C}$ are connected as a second input to each of the gates associated with their adjacent higher order stage. That is, the output of gate 212 is connected to second input terminals of gates 214 and 216; the output of gate 216 is connected to second input terminals of gates 218 and 220; etc. The outputs of the AND gates associated with the next-to-the-highest order stage. (i.e., gates 222 and 224) are respectively connected to the "Set" and "Clear" terminals 208a and 208b of the highest order stage (stage E).

Also included in the counter arrangement of FIG. 2 is an additional toggle type flip-flop 226 which is termed the "tracking" or units driver control flip-flop. The tracking flip-flop 226 receives as its input the output from the crystal controlled clock 10 (FIG. 1) and has a pair of output terminals T and $\bar{T}$ which are respectively connected to first input terminals of coincidence circuits (AND gates) 228 and 230 labeled T and $\bar{T}$. The other input to each of these gates is connected to the output of the clock circuit 10. The output from the T gate 228 is connected to the second input terminals of the gates 210 and 212 while the output of the $\bar{T}$ gate 230 is connected to the toggle input terminal 200a of the lowest order stages 200 of the counter.

The true output from the individual stages of the Gray Code counter 14 is applied by way of conductors 16 through 30 to a set of digit drivers indicated generally by numeral 32. The digit drivers 32 are amplifying circuits which respond to the outputs from the individual stages of the Gray Code counter 14 to apply either positive or negative currents to their output terminals, depending upon the binary state of the particular counter stage to which a given digit driver is connected. The output terminals of the digit drivers 32 are individually connected to the digit/sense lines 34 through 48 of a first word organized memory array shown enclosed by the dash lined box 50.

While it is perhaps possible to implement the memory array 50 with various components, e.g., semiconductor devices, toroidal magnetic cores, etc., in the preferred embodiment of the present invention the memory array 50 is made up of so-called "MATED FILM" memory elements. The method of fabrication and mode of operation of such elements is fully set forth in the Morgan, et al, U.S. Pat. No. 3,470,548 which is assigned to the assignee of the present application as well as in the other patents and applications referred to in the above-mentioned Morgan, et al, patent.

As is indicated in FIG. 1a the word organized memory array 50 is comprised of a plurality of vertically extending digit/sense lines 34 through 48 and a plurality of horizontally extending word lines 52 through 68 and at each intersection of a word line and a digit/sense line is a MATED FILM storage element represented diagrammatically by circles 70.

As is well known in the art, information may be entered into a MATED FILM element by simultaneously applying thereto a digit current and a word current, the final binary state of the element being determined by the polarity of the digit current applied to the digit/sense line coincident with the turn off or fall time of the word current.

In the same fashion that the digit currents are applied to the digit/sense lines 34 through 48 by means of the digit drivers 32, the word currents are applied to the word lines 52 through 68 by means of word driver circuits, indicated generally by the numeral 72. The word drivers 72, there being one for each of the word lines 52 through 68, respond to an input signal on the lines 74 through 90 by producing a current impulse on the associated word drive lines 52 through 68.

The digit/sense lines 34 through 48 have their output ends individually connected to the input terminals of individual sense amplifiers, indicated generally by the numeral 92. During a readout operation, the sense amplifiers 92 serve to amplify the signals induced on the digit/sense lines 34 through 48 to a level whereby the resulting output from these sense amplifiers can be utilized. In FIG. 1a, the sense amplifiers provide an output to a display register 93. In order to effect the readout operation, a read control circuit 94 is provided which is connected by means of a conductor 96 to the word drivers 72. The read control circuit includes conventional address translating circuitry whereby any one of the word drivers in the set 72 may be selected for producing a read pulse on its associated word drive line 52 through 68. The application of a read pulse to one of the word lines 52 through 68 serves to switch all of the MATED FILM element 70 associated with that selected word line, the switching causing a signal to be induced on each of the digit/sense lines 34 through 48, the polarity of such induced signals being indicative of the then binary state of the storage element located at the intersections of the selected word line with the several digit lines.

The output from the crystal clock 10 is also connected by way of a conductor 98 to a network termed "units driver control" and identified by the numeral 100. The units driver control may be the tracking flip-flop 226 of FIG. 2. The units driver control 100 has two outputs 102 and 104. Output line 102 connects to the Gray Code counter 14 and serves as an enabling signal for the plural stages thereof. The output line 104 is connected directly to a digit driver 106 and to the input of a serial delay line indicated generally by the numeral 108. Each tap 110 through 126 along the delay line is connected as an input to a corresponding digit driver 128 through 144. The digit drivers 106 and 128 through 144 may be identical in all respects to the digit drivers indicated generally by the numeral 32.

The digit drivers 106 and 128 through 144 provide digit current inputs to the digit/sense lines 146 through 164 of a second word organized memory array shown enclosed by dash lined box 166. The array 166, like array 50, in the preferred embodiment is implemented with MATED FILM type storage elements. The word lines for the array 166 are a continuation of the word lines threading the array 50, i.e., word lines 52 through 68.

Each of the digit/sense lines 146 through 164 has its output end connected as an input to a series of sense amplifiers indicated generally by numeral 168, there being one such sense amplifier for each of the digit/sense lines threading the storage array 166. The individual outputs from the sense amplifiers 168 are connected to individual stages of a decimal counter register 170.

Now that the construction of the preferred embodiment of the invention has been described in detail, attention will be given next to its mode of operation and in this regard the waveforms illustrated in FIG. 3 will be employed to facilitate the understanding thereof.

OPERATION

Every 10 nanoseconds the crystal clock 10 emits a short duration clock pulse as is illustrated in the uppermost waveform in FIG. 3. These clock pulses are applied by way of conductor 12 to the tracking flip-flop 226 associated with the Gray Code counter 14. With all stages in the Gray Code counter initially set to the 0 state, the gate 230 is enabled. Hence, when the first pulse is obtained from the clock source 10, it passes through the enabled gate 230 to the toggle input terminal 200a of the stage A flip-flop 200, causing it to switch to its 1 state. The clock pulse also passes directly to the tracking flip-flop 226, changing it to its 1 state also. Hence, after the first pulse, the stage A flip-flop and the tracking flip-flip are set and the remaining flip-flop stages B, C, D and E remain in their 0 state. The gates 228 and 210 are enabled.

Ten nanoseconds later, the second clock pulse occurs and passes through the enabled gates 228 and 210 causing a toggle pulse to be applied to the input terminal 202a of the stage B flip-flop 202, changing stage B to its 1 state. The second clock pulse also goes directly to the tracking flip-flop 226, causing it to revert back to its 0 state.

The third clock pulse occurring at the 30 nanosecond point passes through the gate 230, which is enabled when the tracking flip-flop 226 is cleared, to the toggle input terminal of stage A, changing stage A from a 1 to a 0. The fourth clock pulse changes stage C to its 1 state, and so forth.

To summarize the operation of the counter, then, the tracking flip-flop 226 and its associated gates 228 and 230 serve to pass a clock pulse alternately to the first stage of the counter as well as to the remaining stages depending upon the enabled condition of the gates 210 through 224 as established by the state of their associated flip-flops A through D. When the gates 212, 216, 220 and 222 are enabled, a clock pulse passing through gate 228 will set stage E to its 1 state and when gates 212, 216, 220 and 224 are enabled and a pulse is passed by the gate 228, the stage E flip-flop will be cleared to its 0 state.

Thus, for a five stage counter, as the clock pulses are applied, the count registered in the various stages is as set forth in the following Table I.

The conductors 16 through 30 shown in FIG. 1 are connected to the true output terminals A, B, C, etc., of the individual stages of the Gray Code counter illustrated in FIG. 2.

TABLE I

| CLOCK PULSE NO. | STAGE | | | | |
|---|---|---|---|---|---|
| | A | B | C | D | E |
| 0 | 0 | 0 | 0 | 0 | 0 |
| 1 | 1 | 0 | 0 | 0 | 0 |
| 2 | 1 | 1 | 0 | 0 | 0 |
| 3 | 0 | 1 | 0 | 0 | 0 |
| 4 | 0 | 1 | 1 | 0 | 0 |
| 5 | 1 | 1 | 1 | 0 | 0 |
| 6 | 1 | 0 | 1 | 0 | 0 |
| 7 | 0 | 0 | 1 | 0 | 0 |
| 8 | 0 | 0 | 1 | 1 | 0 |
| 9 | 1 | 0 | 1 | 1 | 0 |
| 10 | 1 | 1 | 1 | 1 | 0 |
| 11 | 0 | 1 | 1 | 1 | 0 |
| 12 | 0 | 1 | 0 | 1 | 0 |
| 13 | 1 | 1 | 0 | 1 | 0 |
| 14 | 1 | 0 | 0 | 1 | 0 |
| 15 | 0 | 0 | 0 | 1 | 0 |
| 16 | 0 | 0 | 0 | 1 | 1 |
| 17 | 1 | 0 | 0 | 1 | 1 |
| 18 | 1 | 1 | 0 | 1 | 1 |
| 19 | 0 | 1 | 0 | 1 | 1 |
| 20 | 0 | 1 | 1 | 1 | 1 |
| 21 | 1 | 1 | 1 | 1 | 1 |
| 22 | 1 | 0 | 1 | 1 | 1 |
| 23 | 0 | 0 | 1 | 1 | 1 |
| 24 | 0 | 0 | 1 | 0 | 1 |
| 25 | 1 | 0 | 1 | 0 | 1 |
| 26 | 1 | 1 | 1 | 0 | 1 |
| 27 | 0 | 1 | 1 | 0 | 1 |
| 28 | 0 | 1 | 0 | 0 | 1 |
| 29 | 1 | 1 | 0 | 0 | 1 |
| 30 | 1 | 0 | 0 | 0 | 1 |
| 31 | 0 | 0 | 0 | 0 | 1 |
| 32 | 0 | 0 | 0 | 0 | 0 | s such, they continuously carry a signal of one binary sense or the other depending upon the current state of the plural counter stages. These output lines 16 through 30 are connected as inputs to a set of digit drivers, there being one such digit driver 32 for each of the plural stages of the counter 14. The digit driver is an amplifier which applies a signal of a positive or negative polarity to its output line depending upon the binary state of the input signal thereto. The waveforms labeled "Gray Code digit drivers" in FIG. 3 represent the output signals from the various identified stages as a function of time as the clock pulses are applied to the counter 14. The output from the digit drivers then cause currents to flow in the digit/sense lines 34 through 48 in a direction determined by the polarity of the digit driver output signals.

The clock pulses from the crystal clock 10 are also applied by way of conductor 98 to the units driver control network 100. The units driver control may be considered as the tracking flip-flop 226 of FIG. 2. Hence, its output is a pulse pattern which reverses state every 10 nanoseconds, assuming a 10 nanosecond clock rate. This pulse pattern is depicted in FIG. 3 by the waveform 232. The output from the units driver control network 100 is applied by way of conductor 104 to a digit driver 106 associated with the leftmost column of MATED FILM storage element in the array 166. The digit driver 106, like the digit drivers 32, applies a current pulse to the digit/sense line 146, the polarity of which is dependent upon the binary state of the input signal applied to the driver 106.

The output from the units driver control 100 is also applied to a multi-tap delay line indicated generally by the numeral 108. Each segment of the delay line in the preferred embodiment here described is designed to introduce a 1 nanosecond delay to a signal applied to the input of that segment. Hence, a pulse applied by way of conductor 104 is delayed a total of 9 nanoseconds while passing down the entire length of the line. Provided at the output tap of each incremental delay element is a conductor 110 through 126 which serves to apply the delayed outputs to a corresponding set of digit line drivers 128 through 144. These drivers, like the ones previously described, serve to apply a current to their associated digit/sense lines 148 through 164, the polarity of which is determined by the binary state of the input signal applied to the associated driver network.

The waveforms 1 through 9 labeled "Drivers 128–144" in FIG. 3 show the manner in which the output from the tracking flip-flop (units driver control) is successively delayed. It is to be noted that by providing the multi-tap serial delay line and associated drivers, the applied input signal is, in effect, subdivided into 10 equal parts. Thus, for a clock rate of 10 nanoseconds, the output from the tracking flip-flop is subdivided into ten 1 nanosecond intervals, thus effectively decimalizing the tracking pulse. As will be shown more clearly hereinbelow, the memory array 166 can be made to store a quantity representative of the number of 1 nanosecond intervals following the application of a tracking pulse to the Gray Code counter. As such, the memory array 166 and its associated digit/sense drivers when coupled through the delay line 108 to the tracking digit acts as a vernier to the count registered in the Gray Code counter 14.

In order to record data into the MATED FILM memory arrays 50 and 166, it is necessary to simultaneously apply a word current to one of the word lines 52 through 68 along with the outputs from the digit drivers 32, 106 and 128 through 144. When operating as a time of event recorder, the event input lines 74 through 90 are individually connected to external sensors (not shown) which activate one of the lines 74 through 90 at the occurrences of a given event associated with one of these lines. The application of an event signal to one of the lines 74 through 90 energizes its associated word driver 72 which, in turn, applies a word current to a given one of the word lines 52 through 68, which inductively link all of the MATED FILM elements in a given row of the memory arrays 50 and 156. The MATED FILM elements associated with this energized word line in the memory array 50 store the information resident in the Gray Code counter 14 at the time that the event occurs. The MATED FILM elements associated with this same word line in the memory array 166 store a digital value indicative of the number of 1 nanosecond time periods which have elapsed since the application of the last clock pulse from the crystal clock 10. For example, if 7 nanoseconds had elapsed since the application of the immediately preceding clock pulse, the current drivers 128 through 140 would be producing digit currents of a first polarity whereas digit drivers 142 and 144 would be producing digit currents of the opposite polarity.

To read out the information relative to the time of occurrence of a given event, a group of Q address representing signals are applied to the read control network 94 from an external source (not shown) to uniquely select the particular one of $2^q$ word drivers 72 determined by the bit permutations of the address representing signals. The selected word driver applies a word current to the selected word line 52 through 68 causing the MATED FILM elements 70 associated with the selected word line to be switched. The switching action induces a signal in the digit/sense lines 34 through 48 and 146 through 164 which are amplified by the sense amplifiers 92 and 168, causing the selected word to be entered into the output registers 93 and 170. Once the desired information is in the output register 93 it may be operated upon by other logic (not shown, but well known in the art) for converting from Gray Code to decimal, thereby yielding a gross indication of the time which has elapsed between a predetermined starting point and the time at which the event in question occurred. To this value is added the direct decimal value registered in device 170 to yield a precise time indication. The elapsed time between two or more events may be determined by sequentially reading out those words in the memory arrays 50 and 166, converting and storing same in temporary holding registers and then performing a subtract operation on the numbers so stored.

During a read operation the read control network 94 disables the outputs from the digit drivers 32, 106 and 128 through 144 as the word addressing function is taking place. This disabling operation effectively converts the lines 34 through 48 and 146 through 164 to sense lines rather than digit drive lines, preventing the current input data from interfering with the word which it is desired to read out.

Figure 4:
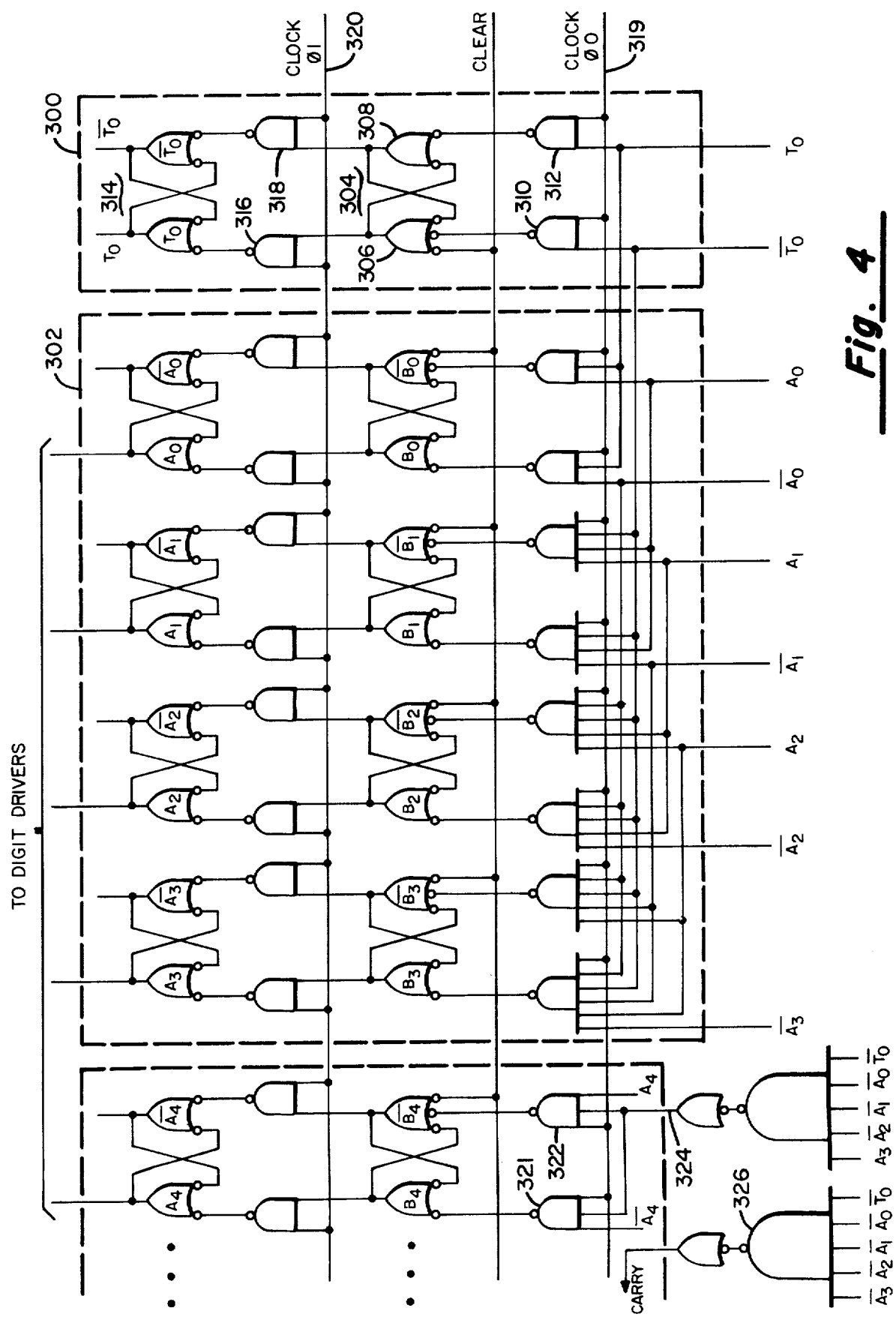
FIG. 4 is an alternative design for a Gray Code counter which is adapted to operate at high speeds, compatible with the high speed switching characteristics of the MATED FILM storage array employed.

It is to be noted that the Gray Code counter shown in FIG. 2 is serial in nature, i.e., enabling signals for the various gates must ripple down through the chain of flip-flops and gates. Where a number of counter stages are cascaded, the delay time of the counter may be such that the high speed switching characteristics of the MATED FILM arrays 50 and 166 may be wasted and the overall performance of the system degraded. FIG. 4 illustrates an alternate design of a Gray Code counter which is more parallel in its organization and therefore able to accommodate a higher speed of operation than the arrangement shown in FIG. 2.

Referring to FIG. 4, there is shown the logic for implementing a Gray Code counter. The counter is comprised of a tracking stage shown enclosed by dash lined box 300 and four counter stages shown as enclosed by dash lined box 302. Each of the counter stages as well as the tracking stage is comprised of a dual master-slave flip-flop. More specifically, the tracking stage includes a master flip-flop 304 comprised of first and second cross-coupled OR gates which respond to relatively low input signals to produce a relatively high output signal. If both inputs are simultaneously high, the output will be low. The gate 306 may be considered as the Set side of the flip-flop and gate 308 as the Clear side. Associated with the Set side of flip-flop 304 is a NAND gate 310 and associated with the Clear side is a NAND gate 312.

Slaved to the flip-flop 304 is a second flip-flop 314, also comprised of cross-coupled OR gates. Disposed between the output from the Set side of the flip-flop 304 and the Set side of the flip-flop 314 is a NAND gate 316. Similarly, the Clear side of the flip-flop 304 is coupled to the Clear side of the flip-flop 314 by a NAND gate 318. Both gates 316 and 318 are adapted to be simultaneously enabled by a $\phi 1$ clock signal applied to the bus 320. The output from the Set side of the flip-flop 314 is identified as the $T_O$ output while the output from the Clear side of this flip-flop is identified as $\overline{T}_O$. These two output lines are coupled back by conductors (not shown) to the correspondingly labeled input lines through the gates 310 and 312 which may be simultaneously enabled by a $\phi 0$ clock signal on conductor 319.

The operation of the tracking stage 300 of the Gray Code counter is as follows.

Let it be assumed that flip-flops 304 and 314 are both in their Set states. As such, the $T_O$ output from flip-flop 314 will be high, as will be the output from the OR gate 306. Under the assumed conditions, the $\overline{T}_O$ output of flip-flop 314 will be low as will be the output from the OR gate 308. When the $\phi 0$ clock signal applied to the input line 319 goes high, NAND gate 312 will be fully enabled and will produce a low input to the Clear side of the flip-flop 308. The other input to gate 308 is high under the assumed conditions and, hence, OR gate 308 outputs a low signal which, when fed back to the input of the OR gate 306, causes it to output a low signal which is fed back to latch the output of gate 308. Hence, it can be seen that the application of the $\phi 0$ clock pulse caused the flip-flop 306 to reverse states such that OR gate 308 is now outputting a high signal while OR gate 306 is outputting a low signal. Subsequently, a positive clock pulse is applied to the $\phi 1$ input terminal and applied over conductor 320 to the inputs of the NAND gates 316 and 318. Only gate 318 will have both of its inputs simultaneously high during this clock phase and it will output a low signal to the Clear side of the flip-flop 314. This low signal forces the output from the Clear side to go high and when this signal is fed back to the Set side OR gate (labeled $T_O$), the flip-flop is latched with a low signal on output line $T_O$ and a high signal on the output line $\overline{T}_O$. Repeated applications of the $\phi 0$ and $\phi 1$ clock signals cause the master and slave units of the tracking flip-flop to alternately switch states.

The four flip-flops shown enclosed by dash lined box 302 are similarly constructed, the master bank of flip-flops being labeled $B_0$, $B_1$, $B_2$ and $B_3$ while the slave rank of flip-flops are labeled $A_0$, $A_1$, $A_2$ and $A_3$. Rather than explaining in detail the various interconnections of these flip-flops and their associated input gates, it is more convenient to express the relationships for setting and clearing the master rank flip-flops by using Boolean equations, it being understood that during the $\phi 0$ clock period the B stages are simultaneously set or cleared and during the $\phi 1$ clock period the slave stages A are simultaneously set or cleared. The following Table II sets forth the conditions under which the stages $B_0$, $B_1$, $B_2$ and $B_3$ will be either set or cleared.

The modulus of the Gray Code counter represented in FIG. 4 can be expanded further by adding additional modules or groups of four master-slave flip-flop units. For simplicity, only the lowest order stages $B_4$ and $A_4$ of the next module are illustrated. In addition to receiving the $\phi 0$ clock input signal, the gates 320 and 322 respectively associated with the Set and Clear sides of the $B_4$ flip-flop also receive a signal on conductor 324 which is a function of the logical states of the four lower order slave flip-flops $A_3$, $A_2$, $A_1$, $A_0$ and the tracking stage $T_0$.

TABLE II

| STAGE | SET | CLEAR |
|-------|-----|-------|
| $B_0$ | $T_0 \overline{A}_0$ | $T_0 A_0$ |
| $B_1$ | $T_0 A_0 \overline{A}_1$ | $T_0 A_0 A_1$ |
| $B_2$ | $\overline{A}_2 A_1 \overline{A}_0 \overline{T}_0$ | $A_2 A_1 \overline{A}_0 \overline{T}_0$ |
| $B_3$ | $\overline{A}_1 \overline{A}_2 \overline{A}_1 \overline{A}_0 \overline{T}_0$ | $A_3 A_2 \overline{A}_1 \overline{A}_0 \overline{T}_0$ |

Thus, state $B_4$ will be set if at the time that the $\phi 1$ clock signal occurs, stage $A_3$ is also set while stages $A_2$, $A_1$, $A_0$ and $T_0$ are simultaneously cleared.

Stages 5, 6 and 7 (not shown) are constructed identically to stages 1, 2 and 3 of module 302 except rather than having the signal $\overline{T}_0$ applied thereto in the manner illustrated, these stages 5, 6 and 7 would have the signal $T_0$, applied. The conditions under which this last mentioned signal will be high is easily deducible from the labels on the inputs to the NAND gate 326. It should also be obvious from the figure as to how the modulus of the counter may be still further expanded by adding still another four stage module, i.e., stages 8, 9, 10 and 11.

Figure 1B:
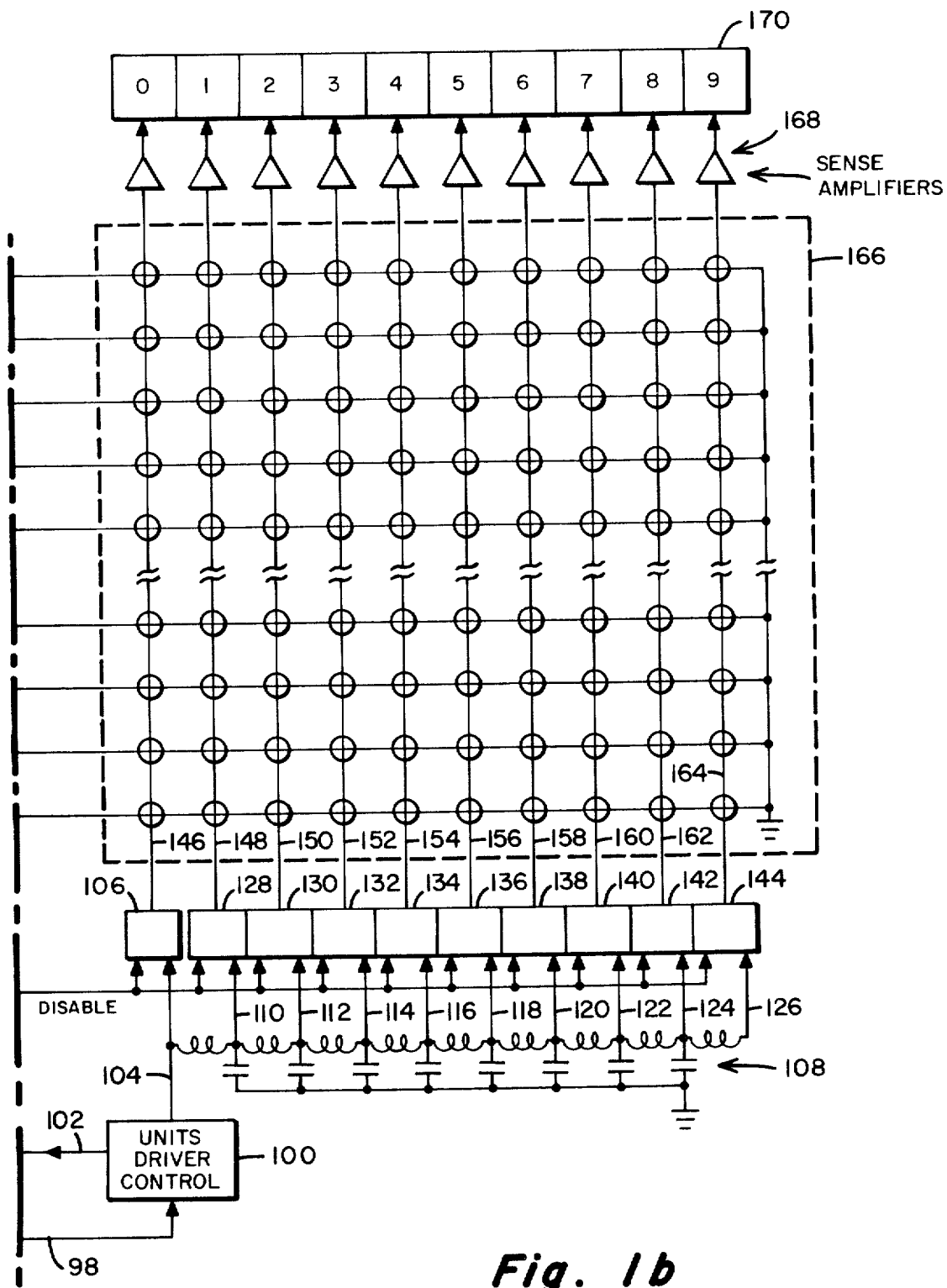

In incorporating the counter of FIG. 4 into the system depicted in FIGS. 1a and 1b, the output from the Set side of each of the slave flip-flops $A_0$ through $A_n$ is connected to a digit/sense line of the storage matrix 50 while the crystal clock 10 is coupled to the $\phi 0$ and $\phi 1$ clock input lines 319 and 320. Table III, below, shows the manner in which the outputs from the Set sides of the slave flip-flops will exist for successive applications of pulses from the tracking stage $T_0$. It can be seen that the device counts in Gray Code as desired.

TABLE III

| ... | $A_4$ | $A_3$ | $A_2$ | $A_1$ | $A_0$ | $T_0$ |
|---|---|---|---|---|---|---|
| | 0 | 0 | 0 | 0 | 0 | 1 |
| | 0 | 0 | 0 | 0 | 1 | 0 |
| | 0 | 0 | 0 | 1 | 1 | 1 |
| | 0 | 0 | 0 | 1 | 0 | 0 |
| | 0 | 0 | 1 | 1 | 0 | 1 |
| | 0 | 0 | 1 | 1 | 1 | 0 |

TABLE III-continued

| $A_4$ | $A_3$ | $A_2$ | $A_1$ | $A_0$ | $I_0$ |
|---|---|---|---|---|---|
| 0 | 0 | 1 | 0 | 1 | 1 |
| 0 | 0 | 1 | 0 | 0 | 0 |
| 0 | 1 | 1 | 0 | 0 | 1 |
| 0 | 1 | 1 | 0 | 1 | 0 |
| 0 | 1 | 1 | 1 | 1 | 1 |
| 0 | 1 | 1 | 1 | 0 | 0 |
| 0 | 1 | 0 | 1 | 0 | 1 |
| 0 | 1 | 0 | 1 | 1 | 0 |
| 0 | 1 | 0 | 0 | 1 | 1 |
| 0 | 1 | 0 | 0 | 0 | 0 |
| 1 | 1 | 0 | 0 | 0 | 1 |
| 1 | 1 | 0 | 0 | 1 | 0 |
| 1 | 1 | 0 | 1 | 1 | 1 |
| 1 | 1 | 0 | 1 | 0 | 0 |
| 1 | 1 | 1 | 1 | 0 | 1 |

Although a specific embodiment of the invention has been shown and described, it should be apparent to those skilled in the art that minor changes and modifications can be made thereto without departing from the spirit and scope of the invention. Hence, the invention is to be determined by the scope of the accompanying claims.

What is claimed is:

1. An event recorder comprising in combination:
   a. a source of regularly occurring timing pullses of a period, T.
   b. counting means having a plurality of bistable stages coupled to said source to receive said timing pulses, said counting means including a pluarlity of bistable stages interconnected such that only one at a time of said plurality of stages is toggled from a first state to a second state upon receipt of individual ones of said timing pulses;
   c. a first word organized memory array having M word lines intersecting with N digit/sense lines and an information storage element located at each such M × N intersection;
   d. a second word organized memory array having M word lines intersecting with P digit/sense lines and an information storage element located at each such M × P intersections;
   e. means connecting said M word lines in said first and second memory arrays in series;
   f. digit current driver means coupling said N digit/sense lines of said first memory array individually to said plurality of bistable stages of said counting means for applying a current of a first polarity to those of said N digit/sense lines associated with said bistable stages which are in a first state and a current of a second polarity to those of said N digit/sense lines associated with said bistable stages which are in a second state;
   g. means including further digit current driver means and delay means for coupling said timing pulses successively to said P digit/sense lines of said second memory array; and
   h. means responsive to the occurrence of an event for applying a current pulse to one of said M word lines to thereby store in the memory elements of said first and second arrays located at the intersection of said one of said M word lines and said N and said P digit/sense lines the instantaneous value contained in said counter means and a value indicative of the elapsed time following the application of the last regularly occurring timing pulse from said source to said counting means.

2. Apparatus as in claim 1 and further including means for reading out the information stored in the elements associated with any one of said M word lines, said readout means comprising:
   a. address decoder means having Q input lines and M output lines, said input lines adapted to receive address representing signals for uniquely energizing one of $2^q = M$ output lines;
   b. means including read current driver means coupling said M output lines to said M word lines;
   c. read control means connected to said read current driver means and to said digit current driver means for applying a read current pulse to the one of said M word lines coupled to said uniquely energized one of said M output lines and for inhibiting said digit current driver means; and
   d. output means coupled to said N and P digit/sense lines of said first and second memory arrays for at least temporarily storing the signals induced in said N and P digit/sense lines at the moment of application of said read current pulse.

3. Apparatus as in claim 1 wherein said first and second word organized memory arrays each comprise a plurality of magnetizable memory elements.

4. Apparatus as in claim 1 wherein said magnetizable memory elements are of the MATED FILM type.

5. Apparatus as in claim 1 wherein said counting means comprises a Gray Code counter.

6. Apparatus as in claim 1 wherein said delay means includes P−1 signal delay elements connected in series, each of said delay elements having a delay period which is a predetermined fraction of said period, T.

7. Apparatus as in claim 6 wherein P−1 of said digit/sense lines are coupled individually to the outputs of each of said P−1 signal delay elements and the remaining digit/sense line is coupled directly to said source of timing pulses.

8. Apparatus as in claim 7 wherein P = 10.

9. Apparatus as in claim 8 wherein N = 16.

10. Apparatus as in claim 2 wherein said output means include:
   a. first and second multi-stage storage registers respectively coupled to the digit/sense lines of said first and second arrays; and
   b. a Gray Code to decimal code converter circuit coupled to the output of said first storage register.

* * * * *